US009125318B2

(12) United States Patent
French, Jr. et al.

(10) Patent No.: US 9,125,318 B2
(45) Date of Patent: Sep. 1, 2015

(54) HANDLE LOCKOUT MECHANISM FOR SCALING BLADE-STYLE SERVERS

(71) Applicant: International Business Machines Corporation, Armonk, NY (US)

(72) Inventors: Michael D. French, Jr., Raleigh, NC (US); Walter A. Goodman, Cary, NC (US); Edward J. McNulty, Raleigh, NC (US); Glenn E. Myrto, Holly Springs, NC (US)

(73) Assignee: Lenovo Enterprise Solutions (Singapore) Pte. Ltd. (SG)

( * ) Notice: Subject to any disclaimer, the term of this patent is extended or adjusted under 35 U.S.C. 154(b) by 149 days.

(21) Appl. No.: 14/090,237

(22) Filed: Nov. 26, 2013

(65) Prior Publication Data

US 2015/0146372 A1  May 28, 2015

(51) Int. Cl.
*H05K 5/00* (2006.01)
*H05K 7/14* (2006.01)
*H05K 7/18* (2006.01)
*H01R 13/62* (2006.01)

(52) U.S. Cl.
CPC .................................. *H05K 7/1489* (2013.01)

(58) Field of Classification Search
CPC ...... E05F 11/00; E05F 2700/04; B63B 19/24; E05B 17/0025; E05C 3/042; H05K 5/0021; H05K 7/1409; H05K 7/02; H05K 7/1411; H05K 7/16; G06F 1/181; G06F 1/185; G06F 1/184; G06F 1/187; G06F 1/188; G11B 33/128; G02B 6/4246; H04M 1/0262
See application file for complete search history.

(56) References Cited

U.S. PATENT DOCUMENTS

| | | | |
|---|---|---|---|
| 6,038,130 A | 3/2000 | Boeck et al. | |
| 6,220,879 B1 * | 4/2001 | Ulrich | 439/160 |
| 6,373,712 B1 | 4/2002 | Bailis et al. | |
| 6,549,424 B1 | 4/2003 | Beseth et al. | |
| 6,790,068 B2 * | 9/2004 | Westphall et al. | 439/325 |
| 7,245,499 B2 | 7/2007 | Stahl et al. | |
| 7,292,457 B2 | 11/2007 | DeNies et al. | |
| 7,589,974 B2 | 9/2009 | Grady et al. | |
| 8,054,638 B2 | 11/2011 | Graybill et al. | |
| 8,203,851 B2 * | 6/2012 | Boetzer | 361/801 |
| 8,289,707 B2 * | 10/2012 | Liao | 361/679.58 |
| 8,416,563 B2 * | 4/2013 | Hou | 361/679.33 |
| 8,605,440 B2 * | 12/2013 | Gong et al. | 361/726 |
| 2004/0264146 A1 * | 12/2004 | Kerrigan et al. | 361/726 |
| 2005/0243534 A1 * | 11/2005 | Robertson et al. | 361/801 |
| 2005/0252759 A1 * | 11/2005 | Ichimaru | 200/523 |
| 2007/0058354 A1 | 3/2007 | Scanlon et al. | |
| 2012/0127658 A1 | 5/2012 | Hartman et al. | |

* cited by examiner

*Primary Examiner* — Hoa C Nguyen
*Assistant Examiner* — Xanthia C Cunningham
(74) *Attorney, Agent, or Firm* — Katherine S. Brown; Jeffrey L. Streets

(57) ABSTRACT

A system includes a chassis, first and second blade servers, and a scalability device. Each blade server is securable within the chassis and includes a scalability port, cam handle for selectively securing the blade server in the chassis, and handle latch for selectively latching the cam handle in a closed position, and lockout mechanism moveable into a position that blocks the handle latch in a latched position. The scalability device includes first and second scalability connectors, wherein positioning the scalability device so that the first scalability connector is coupled to a scalability port of the first blade server and the second scalability connector is coupled to a scalability port of the second blade server causes each lockout mechanism to move into the position that blocks the handle latches in the latched position. Accordingly, the scalability device must be removed before either of the blade servers can be removed.

17 Claims, 6 Drawing Sheets

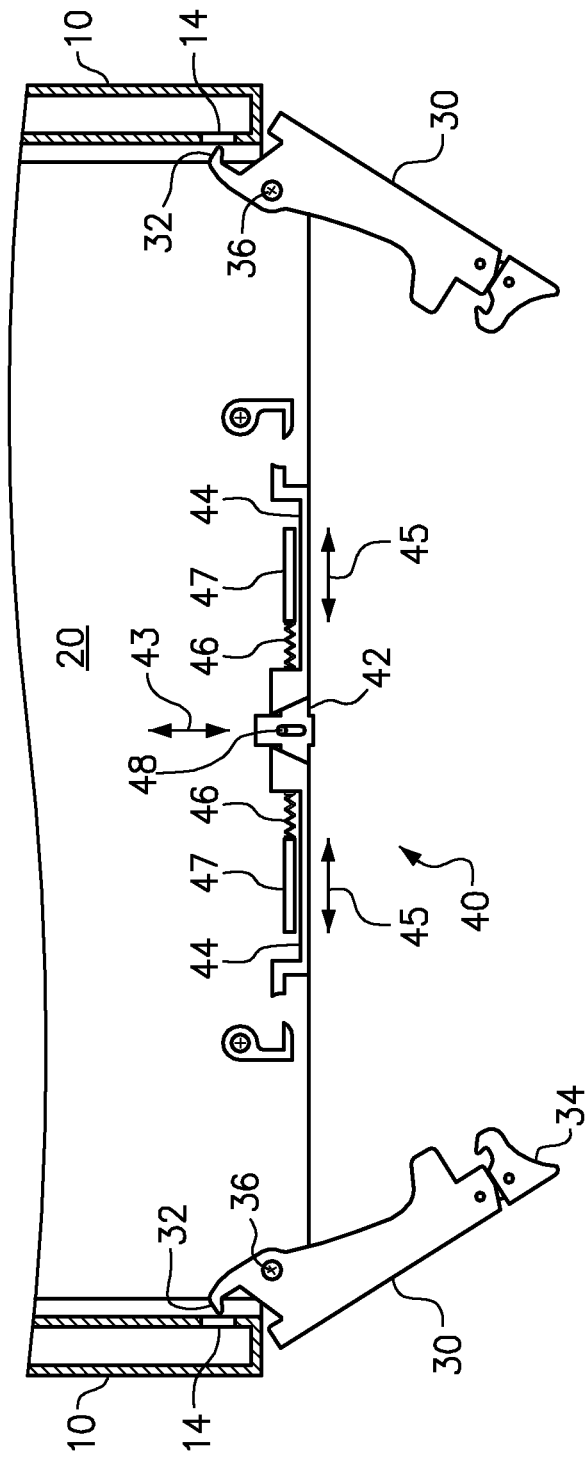

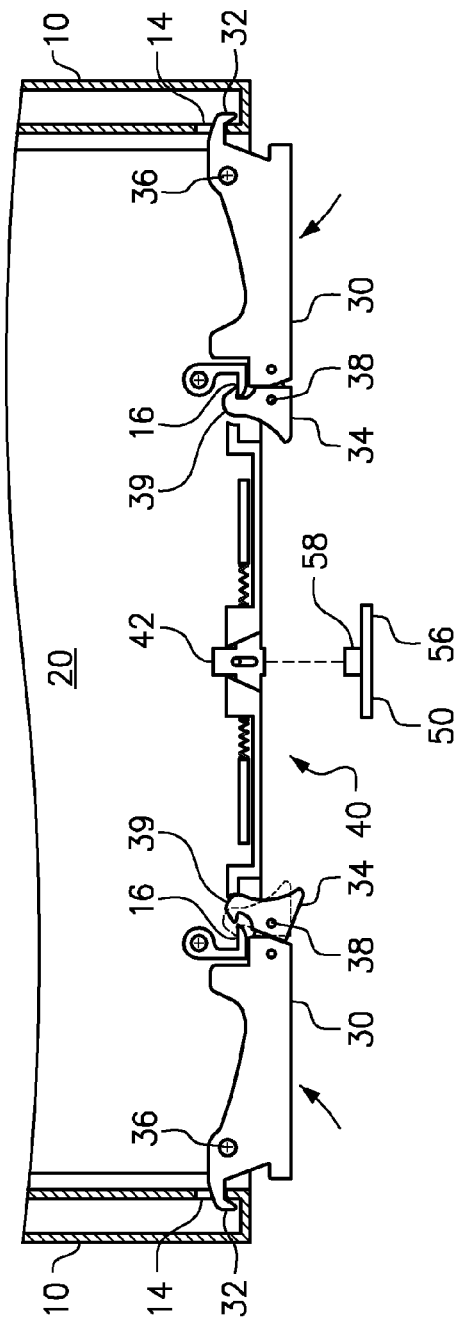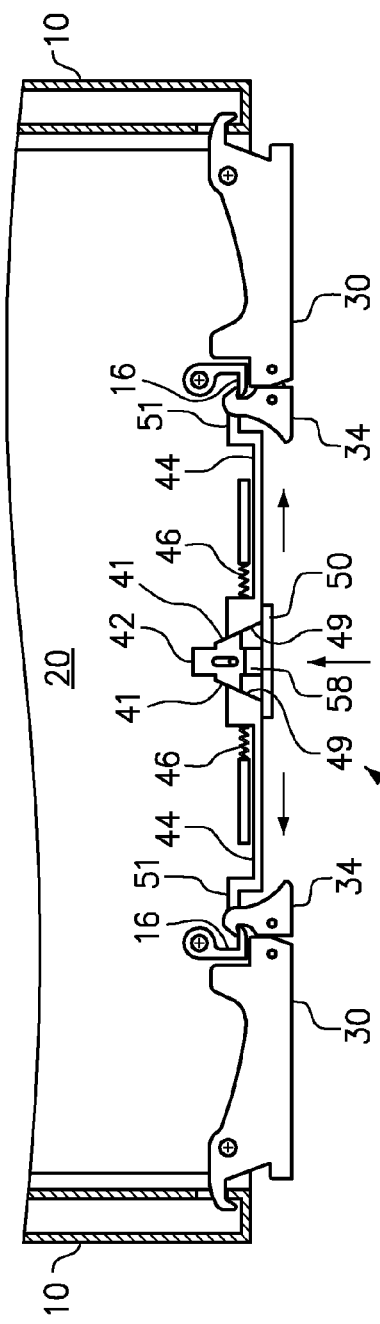

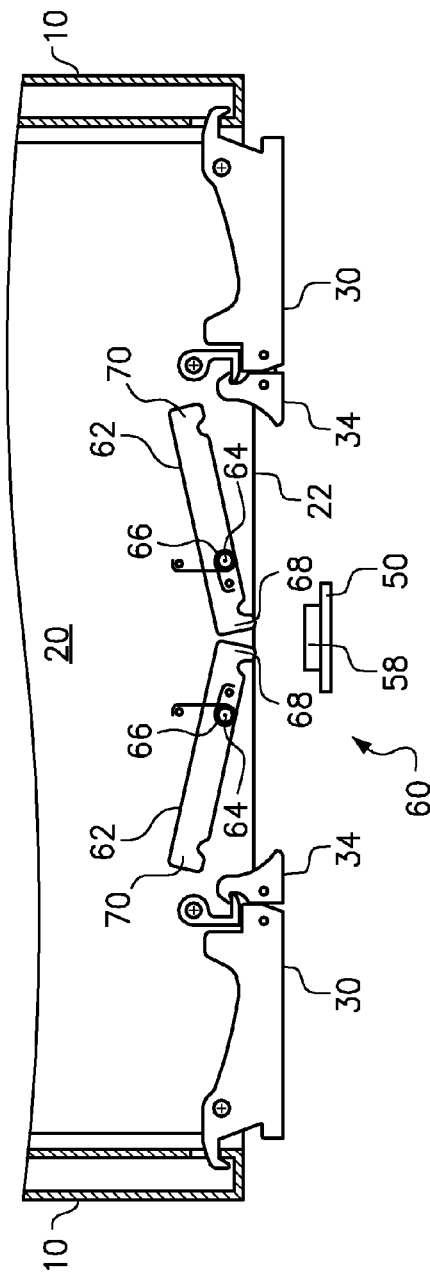
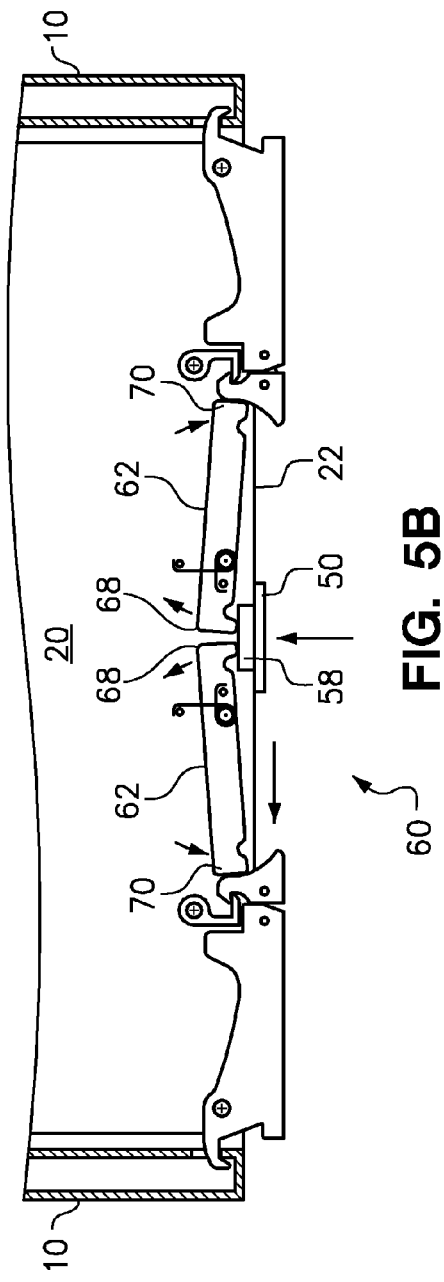

HANDLE LOCKOUT MECHANISM FOR SCALING BLADE-STYLE SERVERS

BACKGROUND

1. Field of the Invention

The present invention relates to apparatus and methods for scaling blade-style servers.

2. Background of the Related Art

Advances in central processor unit (CPU) technology have enabled processors to work in parallel for higher performance. An example of this is Intel's QPI (Quick Path Interconnect) technology. To "scale" processors means to electrically connect CPUs to work together for parallel processing. For example, a 2 CPU server could be scaled to another 2 CPU server, to create a 4 CPU server. This type of scaling is common in rack-style servers, but is increasingly popular in blade-style servers. Scaling blade-style servers is more difficult, because of limited access to the server when installed in a chassis, and the complexity of mechanically and electrically attaching the servers. When blade servers are scaled, relative motion between the server nodes must be prevented or else the scaling connection could be damaged. Current solutions involve mechanically fastening the server nodes together and creating the electrical connection from the side. However, the mechanical and electrical attachments of these solutions require a significant amount space that could otherwise be used for increased functionality.

BRIEF SUMMARY

One embodiment of the present invention provides a system comprising a chassis for housing a plurality of blade servers, first and second blade servers, and a scalability device. The first blade server is securable within the chassis and includes a first scalability port, a first lockout mechanism, and a first cam handle pivotably coupled to the first blade server, wherein the first cam handle has a first cam hook for selectively securing the first blade server in the chassis and a first handle latch for selectively latching the first cam handle in a closed position, and wherein the first lockout mechanism is moveable into a position that blocks the first handle latch in a latched position. Similarly, the second blade server is securable within the chassis adjacent to the first blade server, and includes a second scalability port, a second lockout mechanism, and a second cam handle pivotably coupled to the second blade server, wherein the second cam handle has a second cam hook for selectively securing the second blade server in the chassis and a second handle latch for selectively latching the second cam handle in a closed position, and wherein the second lockout mechanism is moveable into a position that blocks the first handle latch in a latched position. The scalability device includes a first scalability connector in communication with a second scalability connector, wherein positioning the scalability device so that the first scalability connector is coupled to the first scalability port and the second scalability connector is coupled to the second scalability port causes the first lockout mechanism to move into the position that blocks the first handle latch in the latched position and causes the second lockout mechanism to move into the position that blocks the second handle latch in the latched position.

Another embodiment of the present invention provides a method, comprising securing a first blade server into a chassis using a first cam handle pivotally coupled to the first blade server, wherein the first cam handle secures the first blade server with the first cam handle in a closed position, and securing a second blade server into the chassis adjacent to the first blade server using a second cam handle pivotally coupled to the second blade server, wherein the second cam handle secures the second blade server with the second cam handle in a closed position. The method further comprises securing the first cam handle in the closed position using a first handle latch, and securing the second cam handle in the closed position using a second handle latch. First and second scalability connectors on a scalability device are coupled to the scalability connectors of first and second adjacent blade servers. Still further, the method includes the scalability device engaging a first lockout mechanism on a first blade server and moving the first lockout mechanism into a position that blocks the first handle latch in the latched position, and the scalability device engaging a second lockout mechanism on a second blade server and moving the second lockout mechanism into a position that blocks the second handle latch in the latched position.

BRIEF DESCRIPTION OF THE SEVERAL VIEWS OF THE DRAWINGS

FIG. 3A is a schematic top view of a first blade server being inserted into the chassis.

FIG. 3B is a schematic top view of the first blade server being secured within the chassis.

FIG. 3C is a schematic top view of a first blade server coupled to a scalability device that actuates a lockout mechanism that blocks the handle latch.

FIG. 5A is a schematic top view of a first blade server secured within the chassis and having a lockout mechanism according to a second embodiment.

FIG. 5B is a schematic top view of a first blade server secured within the chassis and having received a scalability device that actuates the lockout mechanism according to the second embodiment.

DETAILED DESCRIPTION

Figure 1:
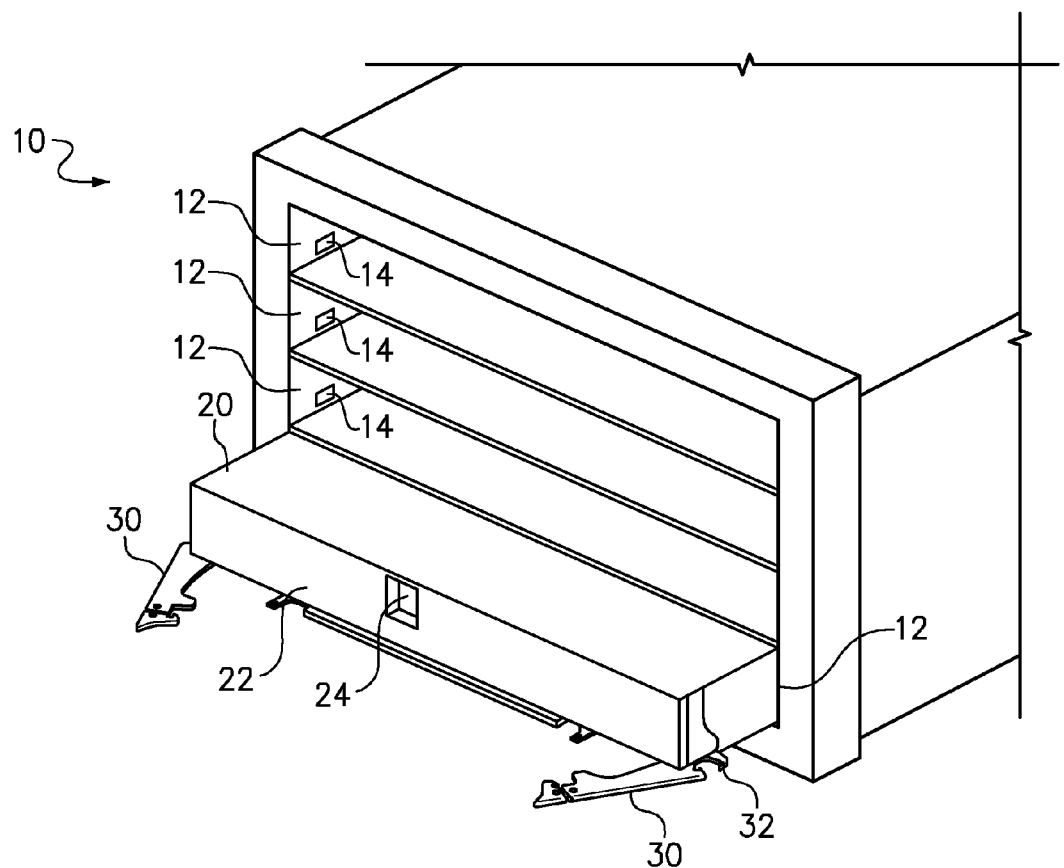
FIG. 1 is a perspective view of a chassis receiving a first blade server.

One embodiment of the present invention provides a system comprising a chassis for housing a plurality of blade servers, first and second blade servers, and a scalability device. The first blade server is securable within the chassis and includes a first scalability port, a first lockout mechanism, and a first cam handle pivotably coupled to the first blade server, wherein the first cam handle has a first cam hook for selectively securing the first blade server in the chassis and a first handle latch for selectively latching the first cam handle in a closed position, and wherein the first lockout mechanism is moveable into a position that blocks the first handle latch in a latched position. Similarly, the second blade server is securable within the chassis adjacent to the first blade server, and includes a second scalability port, a second lockout mechanism, and a second cam handle pivotably coupled to the second blade server, wherein the second cam handle has a second cam hook for selectively securing the second blade server in the chassis and a second handle latch for selectively latching the second cam handle in a closed position, and wherein the second lockout mechanism is moveable into a position that blocks the first handle latch in a latched position. The scalability device includes a first scalability connector in communication with a second scalability connector, wherein positioning the scalability device so that the first scalability connector is coupled to the first scalability port and the second scalability connector is coupled to the second scalability port causes the first lockout mechanism to move into the position that blocks the first handle latch in the latched position and causes the second lockout mechanism to move into the position that blocks the second handle latch in the latched position.

In a preferred option, the chassis forms a first bay for receiving the first blade server and a second bay for receiving the second blade server. The first bay includes a notch in a side wall for receiving the first cam hook extending from the first cam handle, and the second bay includes a notch in a side wall for receiving the second cam hook extending from the second cam handle.

In a further embodiment, the first cam handle and the first handle latch are operable from a front face of the first blade server, the second cam handle and the second handle latch are operable from a front face of the second blade server, the first scalability port is accessible from the front face of the first blade server, and the second scalability port is accessible from the front face of the second blade server. Accordingly, the scalability device may be coupled to the first and second scalability ports without removing the blade servers.

The scalability device may be secured in an installed position by friction between the first scalability connector and the first scalability port and friction between the second scalability connector and the second scalability port. Alternatively, the scalability device may be secured to the blade servers with a latch. The scalability device may also optionally include a first tab aligned with the first lockout mechanism and a second tab aligned with the second lockout mechanism. The use of tabs allows the lockout mechanism to be recessed within the blade server. Alternatively, the lockout mechanism may having other shapes and sizes of features, or extend beyond the blade server, so that some portion of the scalability device will actuate the lockout mechanism. Still further, the scalability device may include a printed circuit board securing the first and second scalability connectors and including conductive traces that provide electronic communication between the first and second scalability connectors.

Embodiments of the system may also be implemented with blade servers that each have two cam handles, which are typically on opposing sides of the blade server. Optionally, the first blade server further includes a third cam handle pivotably coupled to the first blade server on an opposing side of the first blade server from the first cam handle, wherein the third cam handle includes a third cam hook for selectively latching the first blade server in the chassis and a third handle latch for selectively latching the third cam handle in a closed position. Similarly, the second blade server may further includes a fourth cam handle pivotably coupled to the second blade server on an opposing side of the second blade server from the second cam handle, wherein the fourth cam handle includes a fourth cam hook for selectively latching the second blade server in the chassis and a fourth handle latch for selectively latching the fourth cam handle in a closed position.

It should be understood that references to "third" and "fourth" cam handles, or other elements, does not mean that there are three or four cam handles on a particular blade server. Rather, the references "third" and "fourth" are used to identify and distinguish which of the cam handles, or other elements, are being referred to. Since two blade servers may each have two cam handles, for example, the references to "third" and "fourth" prevent confusion that might occur by referring to two "first cam handles" and two "second cam handles."

In another embodiment, the first lockout mechanism includes a first actuator aligned with the scalability device, a first slider extending between the first actuator and the first handle latch and a third slider extending between the first actuator and the third handle latch, wherein the first actuator pushes the first and third sliders into a position blocking the first and third handle latches in the latched position. Similarly, the second lockout mechanism may include a second actuator aligned with the scalability device, a second slider extending between the second actuator and the second handle latch and a fourth slider extending between the second actuator and the fourth handle latch, wherein the second actuator pushes the second and fourth sliders into a position blocking the second and fourth handle latches in the latched position. The sliders are allowed to translate and may be guided by a channel or a gap between two brackets.

In a non-limiting example, the first and second actuators may each form a wedge that is wider near the front. Accordingly, coupling the first and second scalability connectors to the first and second scalability ports causes the scalability device to push the first actuator in a rearward direction such that the wedge pushes the first and third sliders outwardly into the position blocking the first and third handle latches in the latched position, and causes the scalability device to push the second actuator in a rearward direction such that the wedge pushes the second and fourth sliders outwardly into the position blocking the second and fourth handle latches in the latched position. The sliders in each lockout mechanism are preferably spring biased toward the actuator.

Each handle latch may be pivotally secured to a distal end of one of the cam handles. Furthermore, torsion springs may be used to bias each of the handle latches toward a closed position. Each handle latch may include a latch hook that engages a corresponding catch on the blade server when the handle latch is in a closed position, and may also include a release arm for disengaging the latch hook from the first catch.

In an alternatively embodiment of the lockout mechanism, the first lockout mechanism includes a first lever pivotably secured to the blade server. The first lever has a first end positioned for engagement with the scalability device and a second end that blocks the first handle latch in the latched position in response to the first end being engaged and moved by installation of the scalability device. It should be recognized that additional instances of such a lever may be used in place of the actuator and sliders previously described, such that each blade server includes two such levers for locking two handle latches. Optionally, the levers may be spring biased toward a position that does not block first handle latch in the latched position, such that removal of the scalability device allows the lever to pivot to a position that no longer blocks the handle latch.

Another embodiment of the present invention provides a method, comprising securing a first blade server into a chassis using a first cam handle pivotally coupled to the first blade server, wherein the first cam handle secures the first blade server with the first cam handle in a closed position, and securing a second blade server into the chassis adjacent to the first blade server using a second cam handle pivotally coupled to the second blade server, wherein the second cam handle secures the second blade server with the second cam handle in a closed position. The method further comprises securing the first cam handle in the closed position using a first handle latch, and securing the second cam handle in the closed position using a second handle latch. First and second scalability connectors on a scalability device are coupled to the scalability connectors of first and second adjacent blade servers. Still further, the method includes the scalability device engaging a first lockout mechanism on a first blade server and moving the first lockout mechanism into a position that blocks the first handle latch in the latched position, and the scalability device engaging a second lockout mechanism on a second blade server and moving the second lockout mechanism into a position that blocks the second handle latch in the latched position.

Embodiments of the present invention provide blade servers to be scaled together use a scalability device to connect front facing connectors from each blade server. Since the scalability device engages a lockout mechanism in each blade server that disables the cam handles, the blade servers cannot be independently removed once connected. Accordingly, the invention prevents damage to the scalability device that can result when one of the blade servers is moved relative to the other. Furthermore, the lockout mechanism requires very little space inside the blade servers. And since the scalability device is installed from the front of the blade servers, the blade servers do not have to be removed from the chassis in order to install the scalability device.

FIG. 1 is a perspective view of a chassis 10 receiving a first blade server 20. The chassis 10 includes four bays 12, but the chassis may include any number of two or more bays for receiving two or more blade servers. Opposing side walls of each bay 12 include a hole or notch 14 for receiving a cam hook 32 on an end of the cam handle 30. As shown, the blade server 20 include a front face 22 providing accessibility to a scalability port 24.

Figure 2:
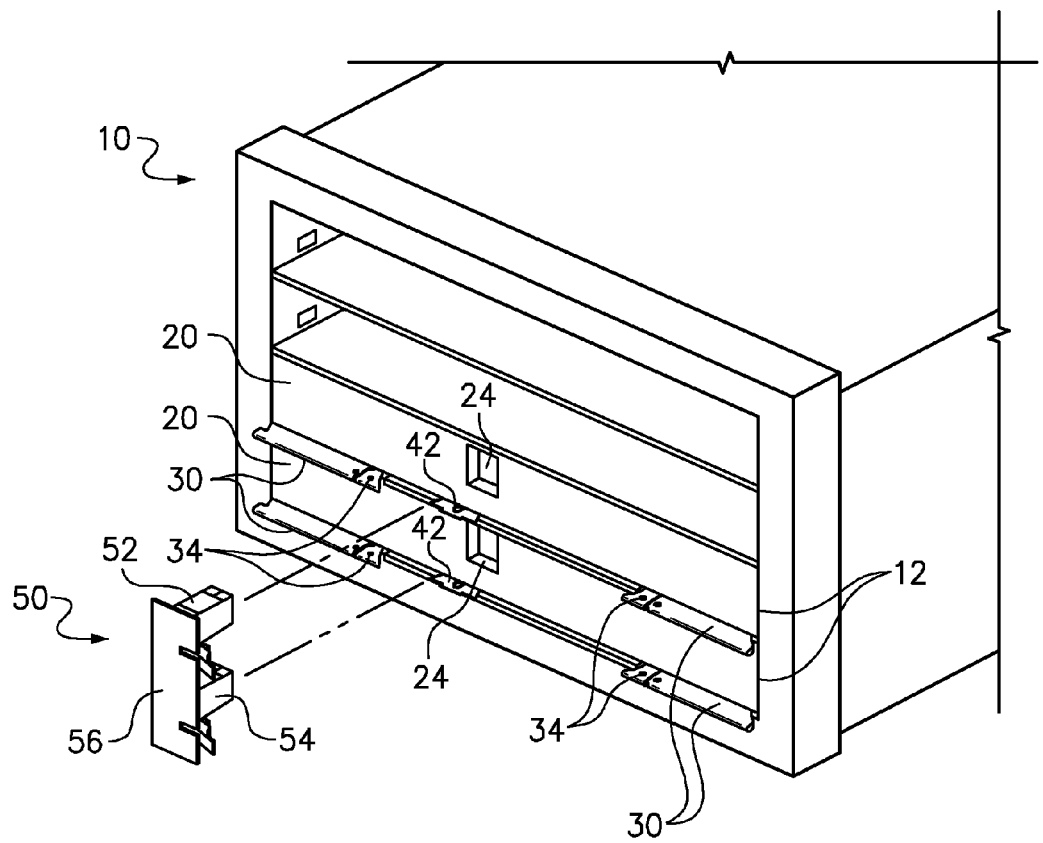
FIG. 2 is a perspective view of the chassis securing first and second blade servers.

FIG. 2 is a perspective view of the chassis 10 securing first and second blade servers 20 in adjacent bays 12 of the chassis. Each of the blade servers 20 has a cam handle 30 in a closed position, such that corresponding cam hooks (not show) are received in notches (not shown) in the side walls of the chassis bays. As a result, the blade servers are secured within the chassis. Furthermore, each cam handle 30 is latched in the closed position by a handle latch 34. The front face of each blade server 20 provides a front-facing scalability port 24.

A scalability device 50 includes a first scalability connector 52 and a second scalability connector 54 extending in the same direction. As shown, the first and second scalability connectors 52, 54 are secured to a printed circuit board 56 that includes conductive traces providing electronic communication between the scalability connectors. The first and second scalability connectors 52, 54 have the same spacing as, and aligned with, the scalability ports 24 of the first and second blade servers 20. Accordingly, the scalability device 50 is coupled to both scalability ports 24 at the same time by aligning the scalability connectors 52, 54 with the scalability ports 24 and pressing the scalability device until the scalability connectors are coupled to the scalability ports. Furthermore, the scalability device 50 is aligned with, and will engage, an actuator 42 that is part of the lockout mechanism in each of the blade servers 20. In the embodiment shown, the scalability device 50 includes first and second tabs (not shown; see tabs 58 in FIG. 4A) that are used to engage the two actuators 42.

FIG. 3A is a schematic top view of a first blade server 20 being inserted into the chassis 10. Many components of the server are omitted in order to clearly show the components, and emphasize the function, of the present invention. As shown, the blade server 20 has been inserted into the chassis 10 to the point that the cam hooks 32 are aligned with the notches 14 in the side wall of the chassis. The two cam handles 30 are both in an open position and pivotally coupled to the blade server at a pivot pin 36.

The blade server 20 also includes a lockout mechanism 40 in accordance with a first embodiment. The lockout mechanism 40 includes an actuator 42 that is moveable inward and outward (see double headed arrow 43) and first and second sliders 44 that are moveable side-to-side (see double headed arrows 45). The actuator 42 includes a longitudinal slot that receives an elongated pin 48 secured to the blade server. A spring 46 is disposed to bias the each slider 44 toward the actuator 42. Optionally, a bracket 47 retains each slider 44 in position, while limiting each slider 44 to the sliding motion indicated (see double headed arrows 45). The bracket 47, or some other structure, may also secure the spring 46 in position. The lockout mechanism 40 is not actuated in FIG. 3A, and will remain in the condition shown until the actuator 42 is acted upon by engagement with the scalability device.

FIG. 3B is a schematic top view of the first blade server 10 being secured within the chassis 10. A shown, the cam hooks 32 have been received into the notches 14 in the side wall of the chassis and the rotation of the cam handles 30 about the pivot pins 36 to the closed position has pulled the blade server 20 into the chassis 10. Presumably, the force applied to the cam handles 30 will seat one or more blind mate connectors (not shown) between the blade server and the chassis.

Each of the cam handles 30 includes a handle latch 34 for securing the cam handle 30 in the closed position. For the purpose of illustration, FIG. 3B shows the handle latch 34 of the cam handle 30 on the left-hand side of the Figure engaging a catch 16 on the blade server 20. Due the angled surfaces of the catch 16 and the handle latch 34, the handle latch 34 is forced to pivot about a pivot axis 38 between the handle latch 34 and the cam handle 30. The force overcomes the bias in a torsion spring (not shown) within the handle latch. However, as the cam handle 30 is pivoted into a closed position shown on the right-hand side of the Figure, a hook 39 on the end of the handle latch 34 clears the catch 16 and the torsion spring pushes the handle latch 34 into a latched position engaged with the catch 16.

Notice that in FIG. 3B, the lockout mechanism 40 has not been actuated. However, the scalability device 50 has a tab 58 that extends from the printed circuit board 56 toward the blade server 20 in alignment with the actuator 42. The tab 58 will engage and actuate the actuator 42 when the scalability device 50 is positioned to couple the scalability connectors with the scalability ports of the two blade servers.

FIG. 3C is a schematic top view of a first blade server 10 coupled to a scalability device 50 that actuates the lockout mechanism 40 that blocks the handle latches 34. With the scalability device 50 is a connected position, the tab 58 has pushed the actuator 42 rearward. The actuator 42 has slanted sides 41, such that the actuator 42 is wider at the front and narrower at the back. A proximal end 49 of the sliders 44 engages the actuator, preferably with a slant that is complementary to the slanted sides 41 of the actuator 42. Accordingly, when the actuator 42 is actuated to move rearward, the sliders 44 overcome the force in the springs 46 and are pushed outwardly toward the sides of the blade server. This movement of the sliders 44 positions a distal end 51 in close proximity to, or in contact with, the handle latch 34.

In the position shown, a user cannot release either of the handle latches 34 from the catch 16 due to the distal end 51 of the sliders 44 physical blocking rotation of the handle latch 34. Accordingly, neither of the two blade servers 20 (see also FIG. 2) can be removed from the chassis 10 without first disconnecting the scalability device 50. Referring back to FIG. 3B, it can be seen that with the scalability device 50 disconnected, the actuator 42 moves forward, the sliders 44 move inwardly toward the actuator, and the handle latches 34 again have room such that a user may manually release the handle latches 34 (see left-hand handle latch 34).

Figure 4A:
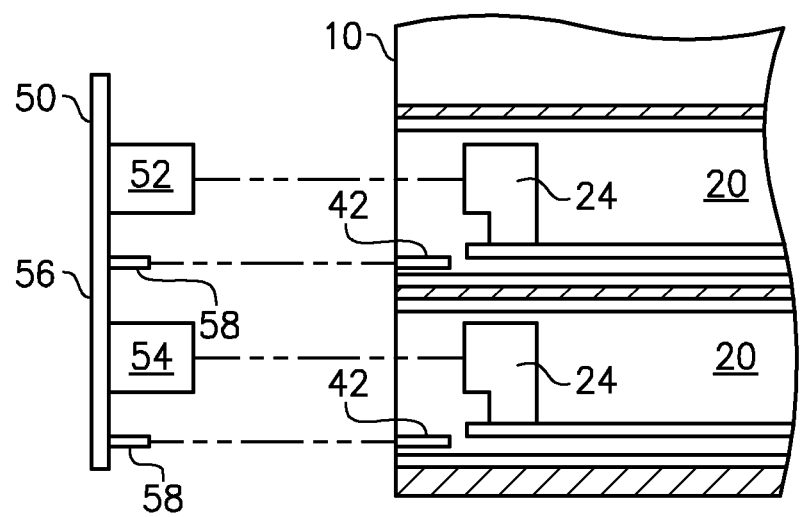
FIG. 4A is a schematic side view of the first and second blade servers secured within the chassis and ready to be scaled together by a scalability device.

FIG. 4A is a schematic side view of the first and second blade servers 20 secured within the chassis 10 and ready to be scaled together by a scalability device 50. It is shown that the first and second scalability connectors 52, 54 on the scalability device 50 are aligned for connection with the first and second scalability ports (connectors) 24 in the first and second blade servers 20. Furthermore, the two tabs 58 are aligned to engage the two actuators 42 of the first and second blade servers 20. This is the only orientation in which the scalability device 50 can be successfully coupled to scale the processors in the first and second blade servers 20. Accordingly, this alignment of the scalability device 50 and the actuators 42 corresponds with the unlocked blade servers (i.e., the lockout mechanism has not been actuated) as shown in FIG. 3B.

Figure 4B:
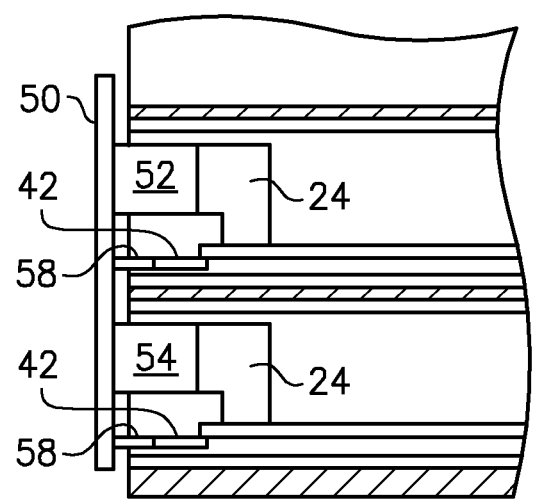
FIG. 4B is a schematic side view of the first and second blade servers secured within the chassis and scaled together by the scalability device.

FIG. 4B is a schematic side view of the first and second blade servers 20 secured within the chassis 10 as shown in FIG. 4A after being scaled together by the scalability device 50. Notice that the first and second scalability connectors 52, 54 on the scalability device 50 are now coupled to the first and second scalability ports (connectors) 24 in the first and second blade servers 20. Also, the two tabs 58 have engaged and pushed the two actuators 42 rearward. Accordingly, this rearward movement of the actuators 42 corresponds with locking of the blade servers (i.e., the lockout mechanism has been actuated) as shown in FIG. 3C.

FIG. 5A is a schematic top view of a first blade server 20 secured within the chassis 10 and having a lockout mechanism 60 according to a second embodiment. The lockout mechanism 60 includes two levers 62 that may operate identically, but in opposite orientations. The operation of one lever 62 will be discussed, and it should be understood that the other lever 62 operates in the same manner. The lever 62 pivots about a pivot pin 64, and includes by a torsion spring 66 so that a first end 68 is biased toward the front of the blade server 20. A second end 70 has a corresponding position that does not interfere with the unlatching of the handle latches 34.

FIG. 5B is a schematic top view of a first blade server 20 secured within the chassis 10 and having received a scalability device 50 that actuates the lockout mechanism 60 according to the second embodiment. When the scalability device 50 is installed (See also FIG. 4B), the tab 58 engages the first end 68 and actuates the levers 62 to pivot about a pivot pin 64. As a result, the second end 70 of the lever 62 pivots forward and into a position in close proximity, or in contact with, the handle latches 34 such that neither of the handle latches 34 may be unlatched. Upon disconnecting the scalability device 50, the torsion springs 66 will automatically return the levers 62 to the position shown in FIG. 5A such that the handle latches 34 may be manually released.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
a chassis for housing a plurality of blade servers;
a first blade server securable within the chassis, the first blade server including a first scalability port, a first lockout mechanism, and a first cam handle pivotably coupled to the first blade server, wherein the first cam handle has a first cam hook for selectively securing the first blade server in the chassis and a first handle latch for selectively latching the first cam handle in a closed position, and wherein the first lockout mechanism is moveable into a position that blocks the first handle latch in a latched position;
a second blade server securable within the chassis adjacent to the first blade server, the second blade server including a second scalability port, a second lockout mechanism, and a second cam handle pivotably coupled to the second blade server, wherein the second cam handle has a second cam hook for selectively securing the second blade server in the chassis and a second handle latch for selectively latching the second cam handle in a closed position, and wherein the second lockout mechanism is moveable into a position that blocks the second handle latch in a latched position; and
a scalability device including a first scalability connector in communication with a second scalability connector, wherein positioning the scalability device so that the first scalability connector is coupled to the first scalability port and the second scalability connector is coupled to the second scalability port causes the first lockout mechanism to move into the position that blocks the first handle latch in the latched position and causes the second lockout mechanism to move into the position that blocks the second handle latch in the latched position.

2. The system of claim 1, wherein the first cam handle and the first handle latch are operable from a front face of the first blade server, wherein the second cam handle and the second handle latch are operable from a front face of the second blade server, wherein the first scalability port is accessible from the front face of the first blade server, and wherein the second scalability port is accessible from the front face of the second blade server.

3. The system of claim 1, wherein the scalability device further includes a first tab aligned with the first lockout mechanism and a second tab aligned with the second lockout mechanism.

4. The system of claim 1, wherein the first blade server further includes a third cam handle pivotably coupled to the first blade server on an opposing side of the first blade server from the first cam handle, wherein the third cam handle includes a third cam hook for selectively latching the first blade server in the chassis and a third handle latch for selectively latching the third cam handle in a closed position, and wherein the second blade server further includes a fourth cam handle pivotably coupled to the second blade server on an opposing side of the second blade server from the second cam handle, wherein the fourth cam handle includes a fourth cam hook for selectively latching the second blade server in the chassis and a fourth handle latch for selectively latching the fourth cam handle in a closed position.

5. The system of claim 4, wherein the first lockout mechanism includes a first actuator aligned with the scalability device, a first slider extending between the first actuator and the first handle latch and a third slider extending between the first actuator and the third handle latch, wherein the first actuator pushes the first and third sliders into a position blocking the first and third handle latches in the latched position, and wherein the second lockout mechanism includes a second actuator aligned with the scalability device, a second slider extending between the second actuator and the second handle latch and a fourth slider extending between the second actuator and the fourth handle latch, wherein the second actuator pushes the second and fourth sliders into a position blocking the second and fourth handle latches in the latched position.

6. The system of claim 5, wherein the first actuator forms a wedge that is wider near the front, wherein coupling the first and second scalability connectors to the first and second scalability ports causes the scalability device to push the first actuator in a rearward direction such that the wedge pushes the first and third sliders outwardly into the position blocking the first and third handle latches in the latched position, and wherein the second actuator forms a wedge that is wider near the front, wherein coupling the first and second scalability connectors to the first and second scalability ports causes the scalability device to push the second actuator in a rearward direction such that the wedge pushes the second and fourth sliders outwardly into the position blocking the second and fourth handle latches in the latched position.

7. The system of claim 5, wherein the first and third sliders are each spring biased toward the first actuator, and wherein the second and fourth sliders are each spring biased toward the second actuator.

8. The system of claim 4, wherein the first handle latch is pivotally secured to a distal end of the first cam handle, the second handle latch is pivotally secured to a distal end of the second cam handle, the third handle latch is pivotally secured to a distal end of the third cam handle, and the fourth handle latch is pivotally secured to a distal end of the fourth cam handle.

9. The system of claim 8, wherein the first cam handle further includes a torsion spring that biases the first handle latch toward a closed position, the second cam handle further includes a torsion spring that biases the second handle latch toward a closed position, the third cam handle further includes a torsion spring that biases the third handle latch toward a closed position, and the fourth cam handle further includes a torsion spring that biases the fourth handle latch toward a closed position.

10. The system of claim 8, wherein the first handle latch includes a first latch hook that engages a first catch on the first blade server when the first handle latch is in a closed position and a first release arm for disengaging the first latch hook from the first catch, the second handle latch includes a second latch hook that engages a second catch on the second blade server when the second handle latch is in a closed position and a second release arm for disengaging the second latch hook from the second catch, the third handle latch includes a third latch hook that engages a third catch on the first blade server when the third handle latch is in a closed position and a third release arm for disengaging the third latch hook from the third catch, and the fourth handle latch includes a fourth latch hook that engages a fourth catch on the second blade server when the fourth handle latch is in a closed position and a fourth release arm for disengaging the fourth latch hook from the fourth catch.

11. The system of claim 1, wherein the scalability device is secured in an installed position by friction between the first scalability connector and the first scalability port and friction between the second scalability connector and the second scalability port.

12. The system of claim 1, wherein the first lockout mechanism includes a first lever pivotably secured to the blade server, the first lever having a first end positioned for engagement with the scalability device and a second end that blocks the first handle latch in the latched position in response to the first end being engaged and moved by the scalability device.

13. The system of claim 12, wherein the first lever is spring biased toward a position that does not block the first handle latch in the latched position.

14. The system of claim 1, wherein the chassis forms a first bay for receiving the first blade server and a second bay for receiving the second blade server, wherein the first bay includes a notch in a side wall for receiving the first cam hook extending from the first cam handle, and wherein the second bay includes a notch in a side wall for receiving the second cam hook extending from the second cam handle.

15. The system of claim 1, wherein the scalability device includes a printed circuit board securing the first and second scalability connectors and including conductive traces that provide electronic communication between the first and second scalability connectors.

16. A method, comprising:
securing a first blade server into a chassis using a first cam handle pivotally coupled to the first blade server, wherein the first cam handle secures the first blade server with the first cam handle in a closed position;
securing a second blade server into the chassis adjacent to the first blade server using a second cam handle pivotally coupled to the second blade server, wherein the second cam handle secures the second blade server with the second cam handle in a closed position;
securing the first cam handle in the closed position using a first handle latch;
securing the second cam handle in the closed position using a second handle latch;
coupling first and second scalability connectors on a scalability device to the scalability connectors of first and second adjacent blade servers;
the scalability device engaging a first lockout mechanism on a first blade server and moving the first lockout mechanism into a position that blocks the first handle latch in the latched position; and
the scalability device engaging a second lockout mechanism on a second blade server and moving the second lockout mechanism into a position that blocks the second handle latch in the latched position.

17. The method of claim 16, wherein the first and second cam handles, first and second handle latches, and the scalability device are accessible from a front face of the chassis.

* * * * *